(12) United States Patent
Morisaki et al.

(10) Patent No.: US 8,328,943 B2
(45) Date of Patent: Dec. 11, 2012

(54) FILM FORMING APPARATUS AND METHOD

(75) Inventors: Eisuke Morisaki, Tsukui-gun (JP);
Hirokatsu Kobayashi, Nirasaki (JP);
Masayuki Harashima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 616 days.

(21) Appl. No.: 12/521,176

(22) PCT Filed: Nov. 29, 2007

(86) PCT No.: PCT/JP2007/073072
§ 371 (c)(1),
(2), (4) Date: Jun. 25, 2009

(87) PCT Pub. No.: WO2008/078502
PCT Pub. Date: Jul. 3, 2008

(65) Prior Publication Data
US 2010/0047448 A1    Feb. 25, 2010

(30) Foreign Application Priority Data

Dec. 25, 2006    (JP) .................................. 2006-348458

(51) Int. Cl.
*C23C 16/00* (2006.01)
(52) U.S. Cl. ........................................ 118/724; 118/725
(58) Field of Classification Search .............. 118/723 R, 118/724, 725; 156/345.52
See application file for complete search history.

(56) References Cited

U.S. PATENT DOCUMENTS

| | | | |
|---|---|---|---|
| 6,217,662 B1 | 4/2001 | Kong et al. | |
| 6,285,010 B1 * | 9/2001 | Fujikawa et al. | 219/411 |
| 6,353,209 B1 * | 3/2002 | Schaper et al. | 219/444.1 |
| 6,878,907 B2 * | 4/2005 | Hiramatsu et al. | 219/444.1 |
| 2006/0185595 A1 * | 8/2006 | Coll et al. | 118/724 |
| 2007/0051316 A1 * | 3/2007 | Ohori et al. | 118/725 |
| 2011/0159210 A1 * | 6/2011 | Patrovsky | 427/561 |

FOREIGN PATENT DOCUMENTS

| | | | |
|---|---|---|---|
| JP | 4-223260 | * | 8/1992 |
| JP | 6-87655 A | | 3/1994 |
| JP | 6-232054 A | | 8/1994 |
| JP | 6-280117 | * | 10/1994 |
| JP | 9 232275 | | 9/1997 |
| JP | 11-176559 | | 7/1999 |
| JP | 2001 156162 | | 6/2001 |
| JP | 2001-156162 | * | 6/2001 |
| JP | 2001-518238 A | | 10/2001 |
| JP | 2001-351966 | | 12/2001 |
| JP | 2001 351966 | | 12/2001 |
| JP | 2003-166059 | | 6/2003 |
| JP | 2004 323900 | | 11/2004 |
| JP | 2004-342450 A | | 12/2004 |
| JP | 2005-68002 A | | 3/2005 |
| JP | 2005-86117 | * | 3/2005 |
| JP | 2005-267863 | | 9/2005 |
| JP | 2006-70325 | | 3/2006 |
| WO | WO 03/039195 A2 | | 5/2003 |

* cited by examiner

Primary Examiner — Luz L. Alejandro
(74) Attorney, Agent, or Firm — Rothwell, Figg, Ernst & Manbeck, P.C.

(57) ABSTRACT

A film forming apparatus includes a processing chamber inside which a vacuum space is maintained and to which a film forming gas is supplied, a substrate supporting unit which is disposed inside the processing chamber and supports a substrate, and a heater which is made of a compound material comprising a high-melting point metal and carbon, is disposed inside the processing chamber, and heats the substrate.

7 Claims, 7 Drawing Sheets

FIG. 2

| MATERIAL | Si | GaAs | SiC |
|---|---|---|---|
| BANDGAP Eg | 1.12eV | 1.43eV | 3.26eV |
| RELATIVE DIELECTRIC CONSTANT $\varepsilon$ | 11.8 | 12.8 | 10 |
| ELECTRON MOBILITY $\mu$ | 1350 cm$^2$/Vs | 8500 cm$^2$/Vs | 1000 cm$^2$/Vs |
| DIELECTRIC BREAKDOWN ELECTRIC FIELD STRENGTH Ec | 3.0×10$^5$ V/cm | 4.0×10$^5$ V/cm | 2.5×10$^6$ V/cm |
| SATURATED ELECTRON DRIFT VELOCITY Vs | 1.0×10$^7$ cm/s | 2.0×10$^7$ cm/s | 2.2×10$^7$ cm/s |
| THERMAL CONDUCTIVITY $\chi$ | 1.5W/cmK | 0.5W/cmK | 4.9W/cmK |

| FILM FORMING GAS IS SUPPLIED TOWARD SUBSTRATE W SUPPORTED BY SUBSTRATE SUPPORTING UNIT 102 INSTALLED IN VACUUM SPACE 101A OF PROCESSING CHAMBER 101 | S1 |

| SUBSTRATE W IS HEATED BY HEATER 104 INSTALLED IN VACUUM SPACE 101A OF PROCESSING CHAMBER 101 | S2 |

FILM FORMING APPARATUS AND METHOD

FIELD OF THE INVENTION

The present invention relates to a film forming apparatus and method which performs film formation on a substrate by using a heater.

BACKGROUND OF THE INVENTION

An epitaxial growth method can grow on a crystal substrate a single crystal having a crystal orientation identical to that of the crystal substrate, and thus is used in various fields.

For example, the following Patent Documents 1 and 2 describe methods for manufacturing a silicon wafer by an epitaxial growth method of Si.

In the above epitaxial growth method, it is preferable that a substrate, on which a predetermined film grows, is heated to a temperature higher than the decomposition temperature of a source gas so that the source gas can be thermally decomposed. Accordingly, induction heating using a coil may be used to heat the substrate for example.

Patent Document 1: Japanese Patent Laid-open Application No. H9-232275
Patent Document 2: Japanese Patent Laid-open Application No. 2004-323900

However, a source gas may have a high thermal decomposition temperature. In such a case, it is required to increase the temperature of the substrate to be higher than the thermal decomposition temperature, which makes it difficult to use the induction heating for a film forming apparatus. For example, in the induction heating using a coil, a power conversion efficiency, i.e., the ratio of thermal energy for heating the substrate to input electric power, is low, resulting in the reduced power utilization efficiency.

Accordingly, especially when decomposing a film forming gas having a high thermal decomposition temperature, the amount of input electric power for induction heating increases, and the cost for film formation increases. Further, in order to heat a substrate to a high temperature, a high frequency electric power supply for induction heating needs to be scaled up and, also, a high frequency shielding structure has to be scaled up and complex, resulting in a scaled up and complicated film forming apparatus.

One of the reasons for the deterioration of the conversion efficiency of the induction heating is that it is difficult to install a coil used for the induction heating near a substrate. For example, the coil for the induction heating is installed outside a processing chamber made of a material having a low dielectric loss, e.g., quartz or the like, and thus cannot be installed near the substrate provided inside the corresponding processing chamber.

On the other hand, in case of a direct heating of a substrate by a heater, the substrate may not be heated to a decomposition temperature of a film forming gas, depending on the film forming gas. For instance, a hydrocarbon-based gas (e.g., a gas represented by $C_xH_y$ (x and y being integers)) generally has a high thermal decomposition temperature. As an example, a decomposition temperature of $C_3H_8$ is about 1200° C., so that the substrate needs to be heated to a temperature higher than or equal to 1200° C. Further, in order to obtain a sufficient film deposition rate and a high film quality, the substrate needs to be heated to about 1500° C. Accordingly, the heater also needs to be heated to a temperature higher than or equal to about 1500° C. However, within the knowledge of the inventors of the present invention, there has never been employed a heater which can endure such high temperature.

Moreover, the heater is provided inside the processing chamber which is maintained in a vacuum state, thereby causing the degassing or the thermal decomposition (sublimation) of the heater itself.

SUMMARY OF THE INVENTION

It is, therefore, a general object of the present invention to provide a noble and useful film forming apparatus and method which solve the above-described problems.

It is a specific object of the present invention to provide a film forming apparatus and method which can perform stable film formation by decomposing a film forming gas having a high decomposition temperature.

In accordance with a first aspect of the present invention, there is provided a film forming apparatus including: a processing chamber inside which a vacuum space is maintained and to which a film forming gas is supplied; a substrate supporting unit which is disposed inside the processing chamber, for holding a substrate; and a heater which is made of a compound material including a high-melting point metal and carbon, is disposed inside the processing chamber, and heats the substrate.

In accordance with a second aspect of the present invention, the compound in the first aspect may be mainly made of TaC.

In accordance with a third aspect of the present invention, a film mainly made of Si and C may be formed on the substrate in the first or the second aspect by using the film forming gas.

In accordance with a fourth aspect of the present invention, the film forming gas in the third aspect may include a gas represented by $C_xH_y$, wherein x and y are integers.

In accordance with a fifth aspect of the present invention, the heater in the fourth aspect may be configured to be heated to a temperature higher than or equal to 1500° C.

In accordance with a sixth aspect of the present invention, the heater in any one of the first to the fifth aspects may be divided into a plurality of parts, and each of the parts may be independently controlled.

In accordance with a seventh aspect of the present invention, at least two of the plurality of parts may be arranged along a flow direction of the film forming gas in the first aspect.

In accordance with an eighth aspect of the present invention, there is provided a film forming method using a film forming apparatus including a processing chamber inside which a vacuum space is maintained and to which a film forming gas is supplied, a substrate supporting unit which is disposed inside the processing chamber and supports a substrate, and a heater which is made of a compound material including a high-melting point metal and carbon, is disposed inside the processing chamber, and heats the substrate, the film forming method including: supplying the film forming gas to the substrate; and heating the substrate by the heater.

In accordance with a ninth aspect of the present invention, the compound in the eighth aspect may be mainly made of TaC.

In accordance with a tenth aspect of the present invention, a film mainly made of Si and C may be formed on the substrate in the ninth aspect by using the film forming gas.

In accordance with an eleventh aspect of the present invention, the film forming gas in the tenth aspect may include a gas represented by $C_xH_y$, wherein x and y are integers.

In accordance with a twelfth aspect of the present invention, the heater in the eleventh aspect may be configured to be heated to a temperature higher than or equal to 1500° C.

In accordance with a thirteenth aspect of the present invention, the heater in any one of the eighth to the twelfth aspects may be divided into a plurality of parts, and each of the parts may be controlled separately.

In accordance with a fourteenth aspect of the present invention, at least two of the parts may be arranged along a flow of the film forming gas in the thirteenth aspect.

Effects of the Invention

In accordance with the present invention, it is possible to provide a film forming apparatus and method which can perform stable film formation by decomposing a film forming gas having a high decomposition temperature.

BRIEF DESCRIPTION OF THE DRAWINGS

FIG. 2 compares characteristics of semiconductor materials.

DETAILED DESCRIPTION OF EMBODIMENTS

Figure 1:
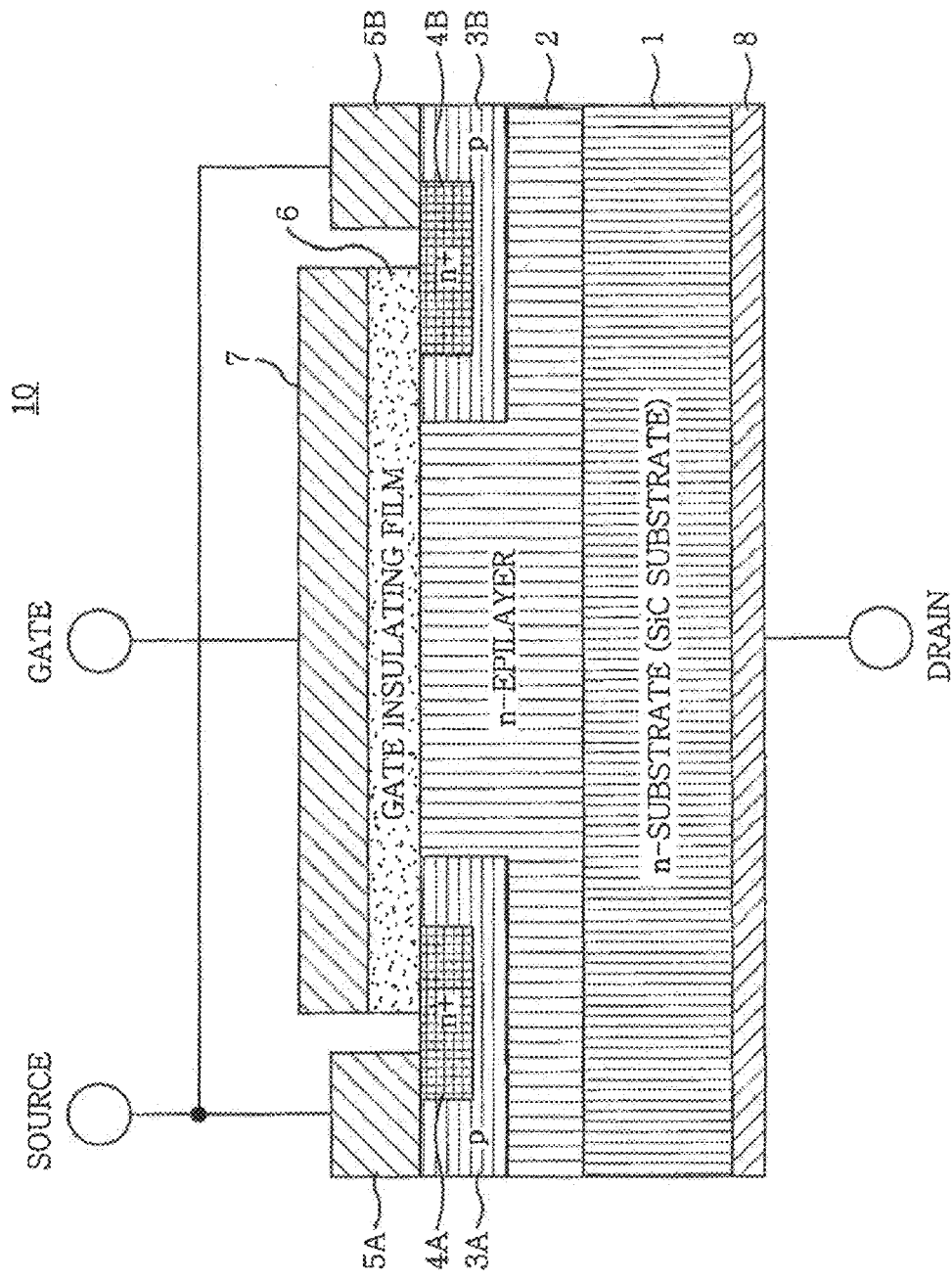
FIG. 1 is a cross sectional view showing an example of a semiconductor device manufactured by an epitaxial growth method.

Hereinafter, embodiments of the present invention will be described with reference to the accompanying drawings. Throughout the drawings, like reference numerals are used for like or corresponding parts, and redundant description thereof will be omitted. Further, the drawings do not intend to specify a relative ratio between members or components or widths between various layers, and specific widths or dimensions should be determined by those who skilled in the art in accordance with the embodiments of the present invention without being limited to the following examples.

FIG. 1 shows an example of a configuration of a semiconductor device (MOS transistor) manufactured by using an epitaxial growth method.

Referring to FIG. 1, a semiconductor device 10 includes a substrate 1 made of an n-type silicon carbide semiconductor (hereinafter, referred to as "SiC") and an n-type SiC layer 2 (n-type epitaxial layer) formed on the substrate 1 (on the surface of the substrate 1). The SiC layer 2 is formed on a substrate by an epitaxial growth method of growing on the crystal substrate a single crystal having a crystal orientation identical to that of the substrate crystal. However, in other embodiments, the SiC layer 2 may not necessarily have a crystal orientation identical to that of the substrate crystal depending on the characteristics of the semiconductor device 10 which is manufactured by a film forming apparatus 100, or may be polycrystalline.

P-type impurity diffusion regions 3A and 3B are formed on the SiC layer 2 to be spaced from each other at a predetermined distance, and n-type impurity diffusion regions 4A and 4B are formed in the p-type impurity diffusion regions 3A and 3B, respectively. Further, a gate insulating film 6 is formed on the SiC layer 2 such that it extends from a part of the n-type impurity diffusion region 4A to a part of the n-type impurity diffusion region 4B, and an electrode 7 is formed on the gate insulating film 6.

Moreover, an electrode 5A is formed on the p-type impurity diffusion region 3A and the n-type impurity diffusion region 4A, and an electrode 5B is formed on the p-type impurity diffusion region 3B and the n-type impurity diffusion region 4B. Furthermore, an electrode 8 is formed on a surface (backside) of the substrate 1 opposite to the SiC layer 2.

In the above semiconductor device (MOS transistor), for example, the electrode 7 serves as a gate electrode; the electrodes 5A and 5B serve as source electrodes; and the electrode 8 serves as a drain electrode.

The above semiconductor device 10 is advantageous in that a so-called on-resistance (resistance of a drift layer) can be drastically reduced in comparison with a conventional semiconductor device using, e.g., Si, thereby resulting in an improvement in the electric power utilization efficiency.

FIG. 2 compares characteristics of Si, GaAs and SiC used as semiconductor materials.

Referring to FIG. 2, it can be seen that SiC has dielectric breakdown electric field strength Ec about ten times higher than that of Si generally and conventionally used in manufacturing a semiconductor device. The on-resistance is inversely proportional to the cube of the dielectric breakdown electric field strength. Hence, in a semiconductor device using SiC having a large dielectric breakdown electric field strength Ec, the electric power utilization efficiency can be improved by reducing the on-resistance.

Further, SiC has a wide band gap compared to Si and GaAs, so that a semiconductor device using SiC can operate at a high temperature. For example, a semiconductor device made of Si can operate at a temperature ranging up to about 150° C., whereas a semiconductor device made of SiC can operate at a temperature higher than or equal to 400° C.

Therefore, a semiconductor device using SiC does not require a cooling unit which is necessary for a conventional semiconductor device and, also, can be used under more severe conditions than the conventional ones.

In addition, in a so-called power device handling at a high current, the use of SiC having a low resistance value makes it possible to reduce a device area, thereby enabling to realize scaling down of an equipment by using the corresponding device.

SiC can be formed by, e.g., an epitaxial growth method. In this case, a gaseous mixture of $SiH_4$ and $H_2$ for example can be used for SiC film formation. Moreover, a hydrocarbon-based gas (gas represented by $C_xH_y$ (x and y being integers) such as $C_3H_8$ or the like which is not easily decomposed can be employed in addition thereto. For example, when $C_3H_8$ is used, the substrate needs to be heated to a temperature higher than or equal to 1200° C., causing the following problems.

For example, in an induction heating using a coil, the electric power utilization efficiency is low. Therefore, especially when decomposing a film forming gas having a high thermal decomposition temperature, the amount of input electric power for induction heating increases to thereby increase the cost for film formation. Further, in order to heat a substrate to a high temperature, a high frequency power supply for induction heating needs to be scaled up and, also, a high frequency shielding structure becomes scaled up and complex, resulting in a scaled up and complicated film forming apparatus.

One of the reasons for the deterioration of the heating efficiency of the induction heating is that it is difficult to install a coil used for the induction heating near a substrate. On the other hand, when a substrate is directly heated by a heating unit such as a heater or the like, the substrate may not be heated to a temperature at which a film forming gas can be decomposed.

Further, when the heater is provided in the processing chamber that is maintained in a vacuum state, the degassing or the thermal decomposition (sublimation) of the heater itself can be caused.

Therefore, in the film forming method in accordance with the embodiment of the present invention, a heater made of a compound including a high-melting point metal and carbon (e.g., a heater mainly made of tantalum carbide) is used as the aforementioned heater. When the heater is made of the compound material that includes, e.g., TaC as a main component thereof, its temperature can be increased up to 1500° C. or above. Accordingly, an SiC film can be epitaxially grown on the substrate by decomposing a film forming gas containing a hydrocarbon-based gas, e.g., $C_3H_8$ or the like, which has a high thermal decomposition temperature by heating the substrate to about 1500° C.

Hereinafter, an example of a configuration of the above film forming apparatus and an example of a film forming method using the film forming apparatus will be described with reference to the drawings.

First Embodiment

Figure 3:
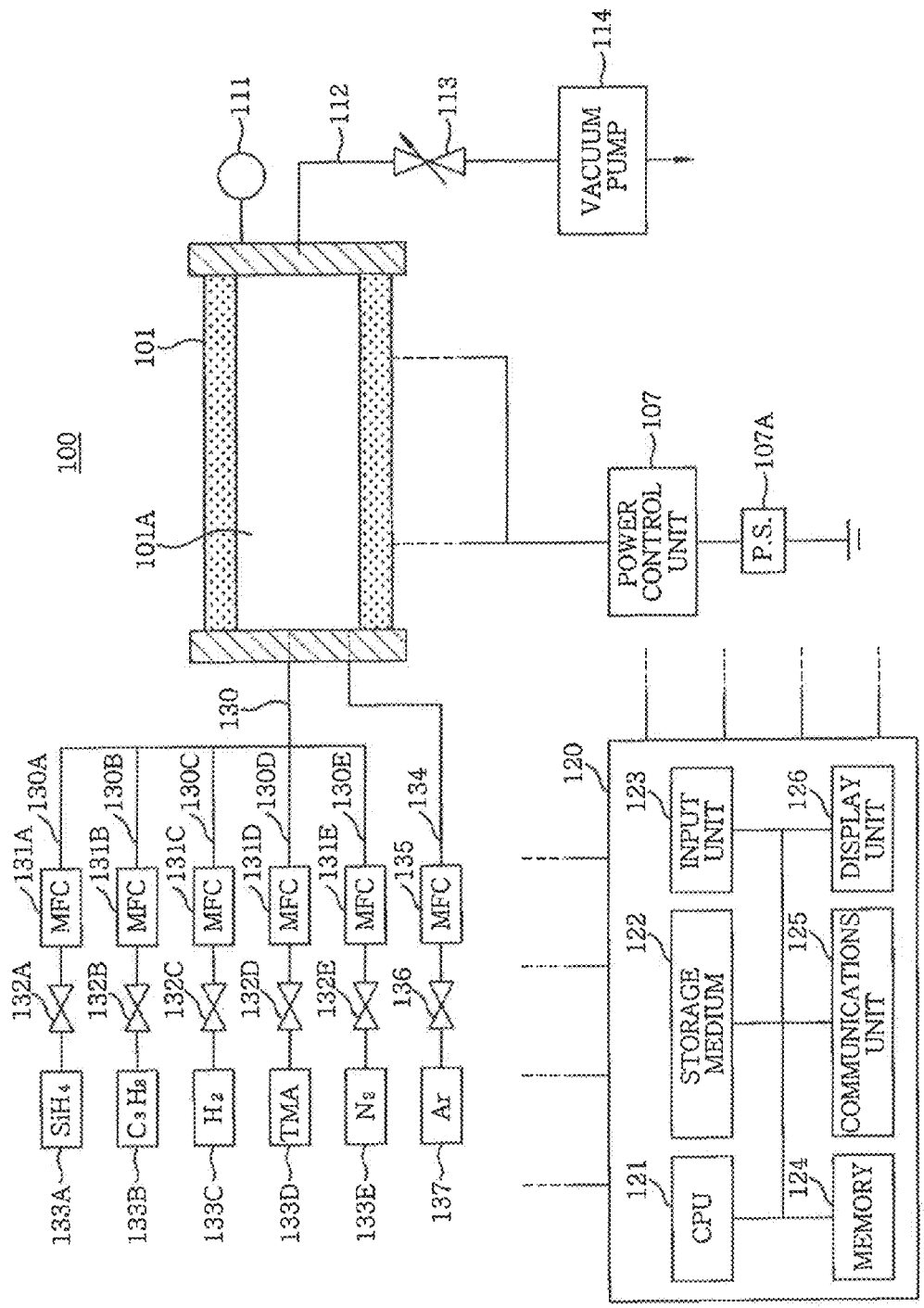
FIG. 3 schematically illustrates an outline of a film forming apparatus in accordance with an embodiment of the present invention.

FIG. 3 schematically illustrates a film forming apparatus 100 in accordance with a first embodiment of the present invention. Referring to FIG. 3, the film forming apparatus 100 has a substantially cuboid-shaped (substantially housing-shaped) processing chamber 101 inside which a vacuum space 101A is defined.

Figure 4:
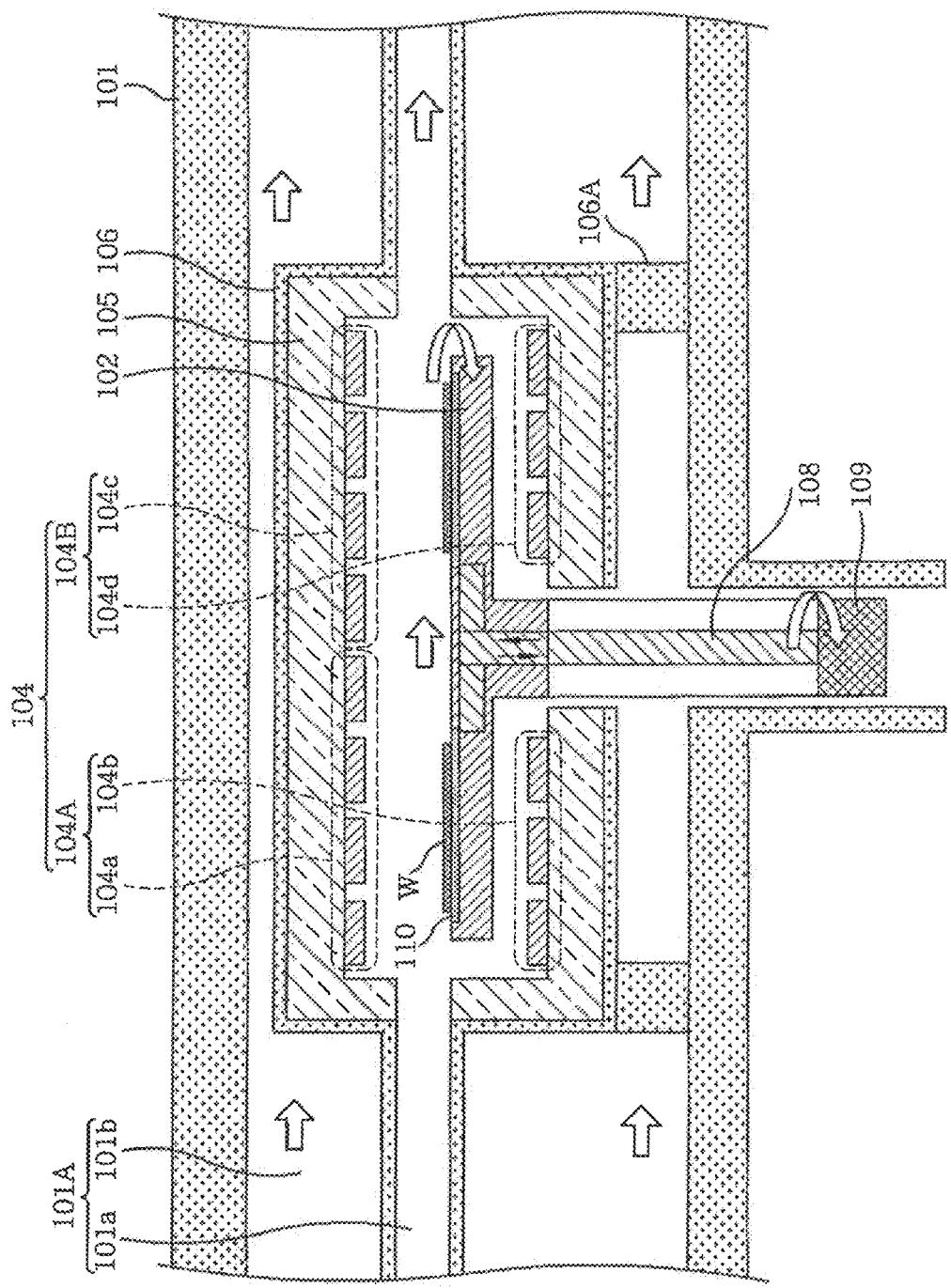
FIG. 4 provides a cross sectional view schematically showing an inner structure of a processing chamber of the film forming apparatus shown in FIG. 3.

Provided in the vacuum space 101A is a substrate supporting unit for supporting a substrate (the substrate and the substrate supporting unit not being shown in FIG. 3, but illustrated in detail in FIG. 4). A semiconductor film grows on the substrate supported by the substrate supporting unit. Further, an inner structure of the vacuum space 101A is not shown in FIG. 3, but is illustrated in detail in FIG. 4 and the drawings thereafter.

Besides, the processing chamber 101 is connected with a gas exhaust unit 114, e.g., a vacuum pump or the like, and a gas exhaust line 112, a pressure control unit 113 with, e.g., a variable conductance valve being provided in the gas exhaust line 112, so that a pressure inside the vacuum space 101A can be adjusted (depressurized) to a pressure lower than the atmospheric pressure. Moreover, the processing chamber 101 is provided with a pressure gauge 111. The pressure inside the vacuum space 101A is controlled by the pressure control unit 113 based on the pressure value measured by the pressure gauge 111.

Further, a power supply 107A connected with a heater to be described later with reference to FIG. 4 is provided outside the processing chamber 101, and the power supply 107A and the corresponding heater are connected with each other via a power control unit 107. For example, the heater may be divided into a plurality of parts as will be described later, and each of the parts may be controlled separately by the power control unit 107.

Also, a film forming gas as a film forming source material is supplied into the processing chamber 101 (the vacuum space 101A) through a gas line 130. Further, the gas line 130 is connected with gas lines 130A, 130B, 130C, 130D and 130E.

The gas line 130A having a mass flow controller (MFC) 131A and a valve 132A is connected with a gas supply source 133A for supplying $SiH_4$ gas, and $SiH_4$ gas is supplied into the processing chamber 101.

In the same manner, the gas lines 130B to 130E having mass flow controllers (MFC) 131B to 131E and valves 132B to 132E are connected with gas supply sources 133B to 133E, respectively. $C_3H_8$ gas, $H_2$ gas, TMA (Trimethylaluminum) gas and $N_2$ gas are supplied from the gas supply sources 133B to 133E, respectively.

For example, when an SiC film epitaxially grows on a substrate in the processing chamber 101, it is preferable to supply $SiH_4$ gas, $C_3H_8$ gas and $H_2$ gas as film forming source gas into the processing chamber 101 while maintaining the substrate to a proper temperature.

Further, if necessary, TMA gas and/or $N_2$ gas may be supplied, in addition to $SiH_4$ gas, $C_3H_8$ gas and $H_2$ gas, into the processing chamber 101, thereby controlling the electrical characteristics of the SiC film that is being formed. The above gases are examples of gases used for film formation. However, the present invention is not limited thereto. An SiC film may be formed by using gases other than the above gases. Besides, instead of the SiC film, other films may be formed by using other gases.

Besides, a cooling gas for cooling the processing chamber 101 is supplied to the processing chamber 101 (the vacuum space 101A) through a gas line 134. The gas line 134 having an MFC 135 and a valve 136 is connected with a gas supply source 137 for supplying a cooling gas (e.g., inert gas such as Ar or the like), so that the cooling gas can be supplied into the processing chamber 101. Specific supply channels of the film forming gas and the cooling gas in the processing chamber 101 will be described later with reference to FIG. 4.

Further, a film forming procedure (e.g., operations including opening and closing of valves, flow rate control, high frequency power application and the like) in the film forming apparatus 100 is performed based on a program referred to as, e.g., a recipe. In this case, the operations of the valve, the MFC and the like are controlled by a control unit 120 having a CPU 121. A connecting wiring thereof is not illustrated.

The control unit 120 includes a CPU 121, a storage medium 122 which stores therein the program, an input unit 123 such as a keyboard or the like, a display unit 126, a communications unit 125 for connection with a network or the like, and a memory 124.

Hereinafter, a structure of the processing chamber 101 will be explained with reference to FIG. 4. FIG. 4 is a cross sectional view schematically showing an inner structure of the processing chamber 101 described in FIG. 3. Here, like reference numerals are used for like parts described above. Referring to FIG. 4, a substrate supporting unit 102 for holding substrates W in the vacuum space 101A is provided inside the processing chamber 101.

The substrate supporting unit 102 and the substrates W supported by the substrate supporting unit 102 are heated by a heater 104 provided near and around the substrates W in the vacuum space 101A. To be specific, the substrates W are heated to a temperature at which surface reaction (epitaxial growth) caused by decomposition of a supplied film forming gas can occur. A material of the heater or the control thereof will be described in detail later.

Further, a heat insulating member 105 is installed between the heater 104/the substrate supporting unit 102 (the substrates W) that is heated and the processing chamber 101.

Accordingly, even when the substrate supporting unit 102 (the substrates W) and the heater 104 are kept at a high temperature, a large temperature difference between the heated portions and the processing chamber 101 can be maintained. As a result, it is possible to suppress the damage in the processing chamber 101 or the generation of released gas.

Moreover, the heat insulating property between the processing chamber 101 and the portions heated to a high temperature in the processing chamber 101 is superior, so that a degree of freedom in selecting a material forming the processing chamber 101 increases. The processing chamber 101 is made of, e.g., quartz. Quartz has high purity and generates, even when heating is performed in a vacuum state, a small amount of released gas that may contaminate a film and thus is preferably used as a material for defining a vacuum space in the case of forming a film for a high performance device. However, the processing chamber 101 can be made of various materials other than quartz.

Further, the substrate supporting unit 102 heated to a high temperature and the heat insulating member 105 in the vacuum space 101A are preferably made of a stable and clean (high purity) material that is hardly decomposed or deteriorated by heating and hardly generates contaminants during heating. For example, the substrate supporting unit 102 and the heat insulating member 105 are preferably made of carbon (graphite).

Furthermore, the substrate supporting unit 102 is preferably made of a high-density carbon material in order to maintain its mechanical strength. As for such carbon material, it is preferable to use one having such a high density as to be referred to as, e.g., a so-called bulk material.

Meanwhile, the heat insulating member 105 is preferably made of a carbon material having a low density to increase its heat insulating property. It is preferable that such carbon material has a considerably higher porosity than that of the bulk material. To be specific, it is more preferable that pores of the carbon material suitable for heat insulation can be seen with, e.g., naked eyes. In this specification, such materials may be referred to as porous materials regardless of the shape of the pores.

In addition, if necessary, the heat insulating member 105 may be made of a carbon material which contains a material for controlling thermal conductivity of carbon so long as the amount of the material is small enough so that it does not contaminate the film formed on a substrate.

In other words, the substrate supporting unit 102 and the heat insulating member 105 are mainly made of the same material (carbon) suitable for heating in a vacuum state. However, these carbons differ from each other in thermal conductivity due to a density difference (microstructure of a material).

Further, a predetermined coating film may be formed on the surface of the heat insulating member 105 or the substrate supporting unit 102. In this embodiment, for example, the surface of the substrate supporting unit 102 is coated with an SiC film, and the surface of the heat insulating member 105 is coated with a carbon film having a higher density than that of the heat insulating member 105. The presence of the coating films makes it possible to preserve the materials and suppress the generation of particles or the reaction between gases and the surface of the heat insulating member.

Furthermore, a heat insulating member supporting structure 106 made of quartz is formed outside the heat insulating member 105 so as to cover the heat insulating member 105. The heat insulating member 105 is separated from the processing chamber 101 at a distance therebetween by the heat insulating member supporting structure 106. Accordingly, a heat insulating space 101b is defined between the processing chamber 101 and the heat insulating member 105, and the temperature increase of the processing chamber 101 is effectively suppressed. The heat insulating member supporting structure 106 is mounted on a bottom surface of the processing chamber 101, and is supported by a columnar support 106A.

Further, a cooling gas (e.g., Ar gas or the like) is supplied through the gas line 134 (shown in FIG. 3) to the heat insulating space 101b. The temperature increase in the processing chamber 101 is suppressed by the cooling action of the cooling gas.

Moreover, a film forming gas is supplied through the gas line 130 (shown in FIG. 4) into a film forming gas supply space 101a where the heat insulating member 105 and the substrate supporting unit 102 defined inside the heat insulating member supporting structure 106 are installed. That is, due to the presence of the heat insulating member supporting structure 106, the film forming gas is effectively supplied to the substrates W without being diffused in the vacuum space 101A. This configuration contributes to improvement in the utilization efficiency of the film forming gas.

In other words, the heat insulating member supporting structure 106 divides the vacuum space 101A substantially into two spaces (the film forming gas supply space 101a and the heat insulating space 101b). Accordingly, it is possible to effectively suppress the temperature increase in the processing chamber 101 and improve the utilization efficiency of the film forming gas.

Further, the substrate supporting unit 102 is formed in a substantially disc shape, and has a recess on a surface thereof. A substantially disc-shaped transfer plate 110 is mounted in the recess, and a plurality of substrates W is mounted on the transfer plate 110. The transfer plate 110 on which the substrates W are mounted is transferred by a transfer unit (to be described later) such as a transfer arm or the like, and is mounted in the recess of the substrate supporting unit 102.

Besides, the substrate supporting unit 102 is configured so that a shaft 108 is inserted into a central opening formed at a central portion of the substrate supporting unit 102. The shaft 108 can rotate and move up and down by a movable unit 109 provided at a lower end of the shaft 108. A substantially disc-shaped leading end portion is formed at an upper end of the shaft 108 to render the overall stepped shape. The leading end portion is fitted into the central opening formed at the center of the transfer plate 110 such that the transfer plate 110 can be lifted. The transfer plate 110 is lifted by the shaft 108 when the transfer plate 110 is transferred.

During the film deposition, the substrate supporting unit 102 and the transfer plate 110 rotate about the shaft 108. Accordingly, the intra- and the inter-substrate variations in a film deposition rate, a film thickness, a film quality and the like can be reduced.

Figures 5, 6:
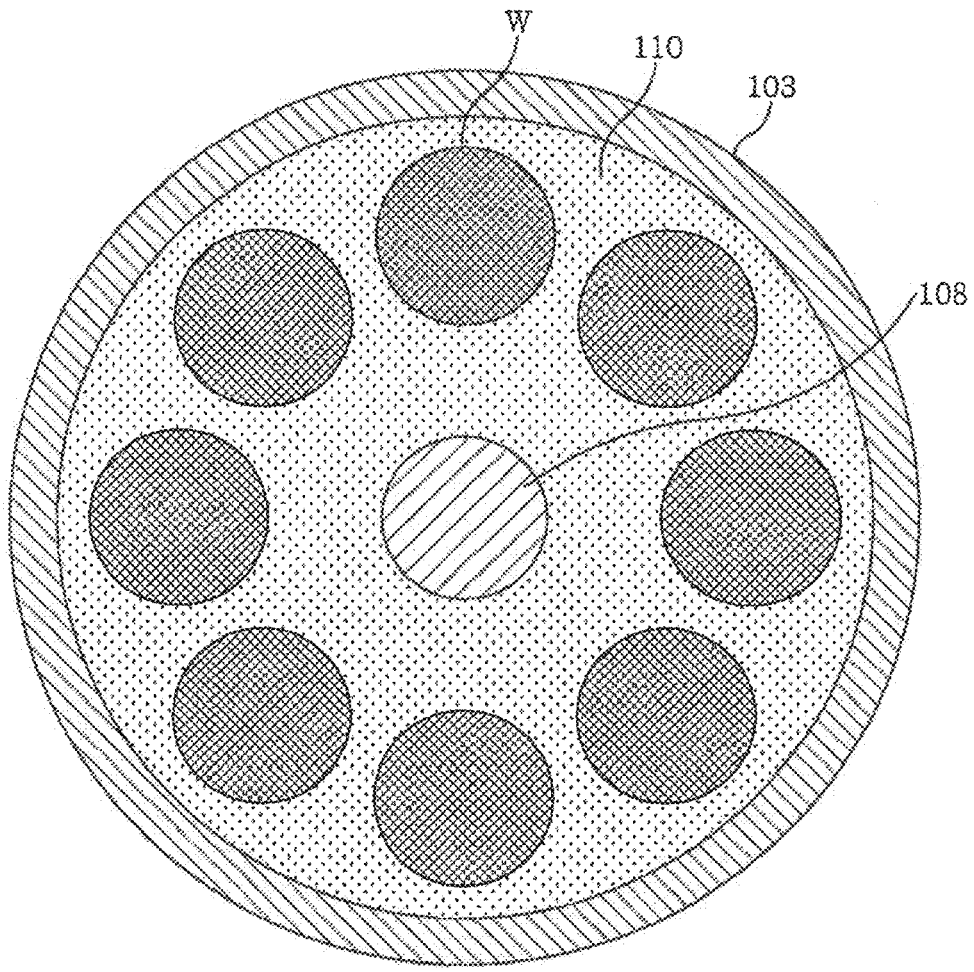
FIG. 5 schematically shows a substrate supporting unit installed inside the processing chamber shown in FIG. 4.
FIG. 6 presents a flow chart illustrating a film forming method in accordance with the embodiment of the present invention.

FIG. 5 is a top view showing the transfer plate 110 mounted on the substrate supporting unit 102 and the substrates W mounted on the transfer plate 110. Further, the leading end portion of the shaft 108 is inserted into the central opening of the transfer plate 110 to be fitted thereto. Although this drawing illustrates, as an example, eight substrates W mounted to be equally spaced at predetermined angles, the mounting position and the number of the substrates are not limited thereto. Further, the transfer plate 110 is heated inside the vacuum space 110A, and thus is preferably made of a material (carbon) same as that of the substrate supporting unit 102.

The film forming apparatus 100 of the present embodiment is provided with the aforementioned heater 104 made of a compound material including a high-melting point metal and carbon, and thus is effectively used, compared to a conventional film forming apparatus, especially when the substrates W are heated to a high temperature. For example, the aforementioned $C_3H_8$ gas is decomposed at a temperature higher than or equal to about 1200° C., so that the substrates W need to be heated to a temperature higher than or equal to at least 1200° C. (e.g., about 1550° C. to 1650° C.).

In the case of a conventional heater, when a substrate is heated up to about 1500° C. in a vacuum space, the heater itself is thermally decomposed (sublimated), so that the substrate cannot be heated. In the case of the heater 104 used in the film forming apparatus 100 of the present embodiment, the heater 104 is made of a compound material including a high-melting point metal and carbon, e.g., a material mainly made of TaC, so that the substrate can be heated to a high temperature of, e.g., about 1550° C. to 1650° C. Further, when the substrate is heated to about 1550° C. to 1650° C., the temperature of the heater 104 becomes about 1750° C. to 1850° C. which is higher than the temperature of the substrate by, e.g., about 200° C.

The heater 104 made of TaC can stably heat the substrates W without being sublimated under the above temperature conditions. Since the heater 104 is made of a material such as TaC that is not easily decomposed or degassed even at a high temperature in a vacuum state, the heater 104 can be installed close to the substrates W (the substrate supporting unit 102).

Moreover, the heater made of TaC may include a heater having a TaC ceramic main body and a heating element embedded in the main body, a heater having a heating element embedded in a base material (e.g., graphite) coated with TaC, and the like.

For example, when the induction heating is used to heat the substrates W, a coil for the induction heating needs to be installed outside the processing chamber 101 (outside the vacuum space 101A), and thus cannot be installed near the substrates W. For that reason, when the induction heating is used, the heating efficiency is low. Especially, the power supply needs to be scaled up to heat the substrates to a high temperature. Further, the high frequency shielding structure becomes scaled up and complicated to perform the induction heating at a high power level, and, further, the entire configuration of the film forming apparatus becomes scaled up and complicated.

Meanwhile, in the film forming apparatus 100 of the present embodiment, a heater made of a compound material including a high-melting point metal and carbon can be disposed near the substrates in the vacuum space 101A. Thus, compared to the induction heating, better heating efficiency can be obtained, and a smaller electric input power may be required. Moreover, when the induction heating is used, a high frequency shielding structure is required to suppress interference caused by the high frequency power applied to the coil for the induction heating. However, when the heater is used, the shielding structure is not needed and, accordingly, the film forming apparatus 100 can be scaled down and simplified.

Further, the temperature of the heater 104 used in the film forming apparatus 100 of the present embodiment which is made of a compound material including a high-melting point metal and carbon, e.g., TaC, can be stably increased to about 2000° C. That is, a heater made of TaC has a higher thermal decomposition (sublimation) temperature than that of a conventional heater made of SiC or the like. Accordingly, the heater 104 is preferably used for an epitaxial growth (growth of SiC) in which the substrates W need to be heated to a temperature higher than or equal to about 1500° C. and a hydrocarbon-based gas (e.g., $C_3H_8$ or the like) is used. Moreover, TaC has a high thermal shock resistance compared to SiC, and thus a stable film forming process can be performed continuously by suppressing generation of cracks or the like even when the temperature sharply increases and decreases repeatedly.

Besides, TaC has a high resistance to a corrosive gas compared to SiC. Therefore, even when the heater 104 used in the film forming apparatus 100 of the present embodiment is provided near the substrates in the vacuum space 101A, it is possible to reduce corrosion or damage of the heater 104 which is caused by a film forming gas, an additional gas, a cleaning gas or the like.

Further, the high-melting point metal is not limited to Ta, and may be another metal, e.g., tungsten (W), molybdenum (Mo) or the like.

Referring back to FIG. 4, since the substrates W are installed in substantially parallel to a flow of the film forming gas, the heater 104 may be divided into a plurality of parts to be disposed along the flow of the film forming gas. Each of the divided parts can be controlled separately and, thus, the temperature uniformity of the substrates W is preferably improved.

For example, the heater 104 of the present embodiment includes heater members 104A and 104B. The heater member 104A is disposed at an upstream gas flow side in the film forming gas supply space 101a, and the heater member 104B is disposed at a downstream gas flow side in the film forming gas supply space 101a. Here, the temperature uniformity of the substrates W can be further improved by controlling the heater members 104A and 104B separately. An example thereof will be described as follows.

A gas at substantially room temperature is introduced into the film forming gas supply space 101a, so that the substrates W and the substrate supporting unit 102 are cooled by the gas at the upstream gas flow side in the film forming gas supply space 101a, and the temperatures of the substrates W and the substrate supporting unit 102 tend to be decreased. On the other hand, the gas being heated at the upstream gas flow side flows at the downstream gas flow side, so that the temperatures of the substrates W and the substrate supporting unit 102 are lowered less. That is, there occurs the temperature distribution in which the temperature is low at the upstream gas flow side and high at the downstream gas flow side. Thus, by setting the input power supplied to the heater member 104A disposed at the upstream gas flow side higher than that supplied to the heater member 104B disposed at the downstream gas flow side, the above temperature distribution can be compensated and, also, the temperature of the substrate supporting unit 102 and further that of the substrates W can be uniformly maintained.

By dividing the heater 104 into a plurality of parts to be disposed along the flow of the film forming gas and controlling each of the divided parts separately, the intra- and the inter-substrate variations of the substrate temperature can be reduced. As a result, a film with less variation in quality can be obtained.

Further, the heater 104 is preferably installed above and below the substrates W (above and below the substrate supporting unit 102) in order to heat the substrates W uniformly. For example, the heater member 104A has an upper upstream side heater element 104a to heat the substrates W through top surfaces of the substrates W and a lower upstream side heater element 104b to heat the substrates W through backsides of the substrates W via the substrate supporting unit 102.

In the same manner, the heater member 104B has an upper downstream side heater element 104c to heat the substrates W through the top surfaces of the substrates W and a lower downstream side heater element 104d to heat the substrates W through the backsides of the substrates W via the substrate supporting unit 102.

In this case, the temperature of the upper upstream side heater element 104a (the upper downstream side heater element 104c) and the temperature of the lower upstream side heater element 104b (the lower downstream side heater element 104d) can be separately controlled. In other words, the heater 104 can be divided into a plurality of parts in a direction crossing the surfaces of the substrates W and control a temperature of each of the part separately.

Further, when the heater 104 is configured to have a plurality of heater elements, the temperature of each heater element may be controlled in accordance with the flow direction of the film forming gas and/or the arrangement position of each heater element with respect to the substrates W (above the surface or below the backside).

For example, in the present embodiment, the temperature of the upper upstream side heater element 104a may be controlled to be higher than that of the upper downstream side heater element 104c. Moreover, while increasing a temperature for example, the temperature of the lower upstream side heater element 104b for heating mainly the substrate supporting unit 102 may be set to be higher than that of the upper upstream side heater element 104a in consideration of thermal capacity of the substrate supporting unit 102.

Further, although the heater 104 is divided into four heater elements in the present embodiment, the number or the arrangement of the divided heater elements can be varied or changed without being limited thereto.

Hereinafter, an example of a film forming method using the film forming apparatus 100 will be described with reference to the flow chart shown in FIG. 6.

First, in a step S1, a film forming gas is supplied toward the substrates W supported by the substrate supporting unit 102 installed in the vacuum space 101A of the processing chamber 101. As described with reference to, e.g. FIG. 3, $SiH_4$ gas, $C_3H_8$ gas and $H_2$ gas are supplied, as a film forming gas, into the processing chamber 101 (film forming gas supply space 101a). Further, if necessary, TMA gas and/or $N_2$ gas may also be supplied.

For example, e.g., $SiH_4$ gas, $C_3H_8$ gas and $H_2$ gas serving as the film forming gas have flow rates of 10 sccm (standard cubic centimeters per minute) to 30 sccm, 10 sccm to 20 sccm and 50 slm (standard liters per minute) to 200 slm, respectively. However, the values are not limited thereto.

Next, in a step S2, the substrate supporting unit 102 (and the substrates W) is heated by the heater 104, and the temperature of the substrates W is maintained at a temperature ranging from 1550° C. to 1650° C. As a result, a film mainly made of Si and C (SiC film) epitaxially grows on each of the substrates W.

Either step 1 or step 2 may be performed first, or steps 1 and 2 may be performed simultaneously. Further, a period of time for each step may be properly adjusted to allow the SiC film to form with a predetermined film thickness.

Hereinafter, an example of a film forming equipment in which the processing chamber 101 is connected with a transfer chamber will be explained. For example, when a semiconductor device is formed on a substrate, a transfer chamber for transferring a substrate (a transfer plate on which the substrate is mounted) is generally used. Accordingly, the film forming equipment has a structure having the transfer chamber, as will be described below.

Figure 7:
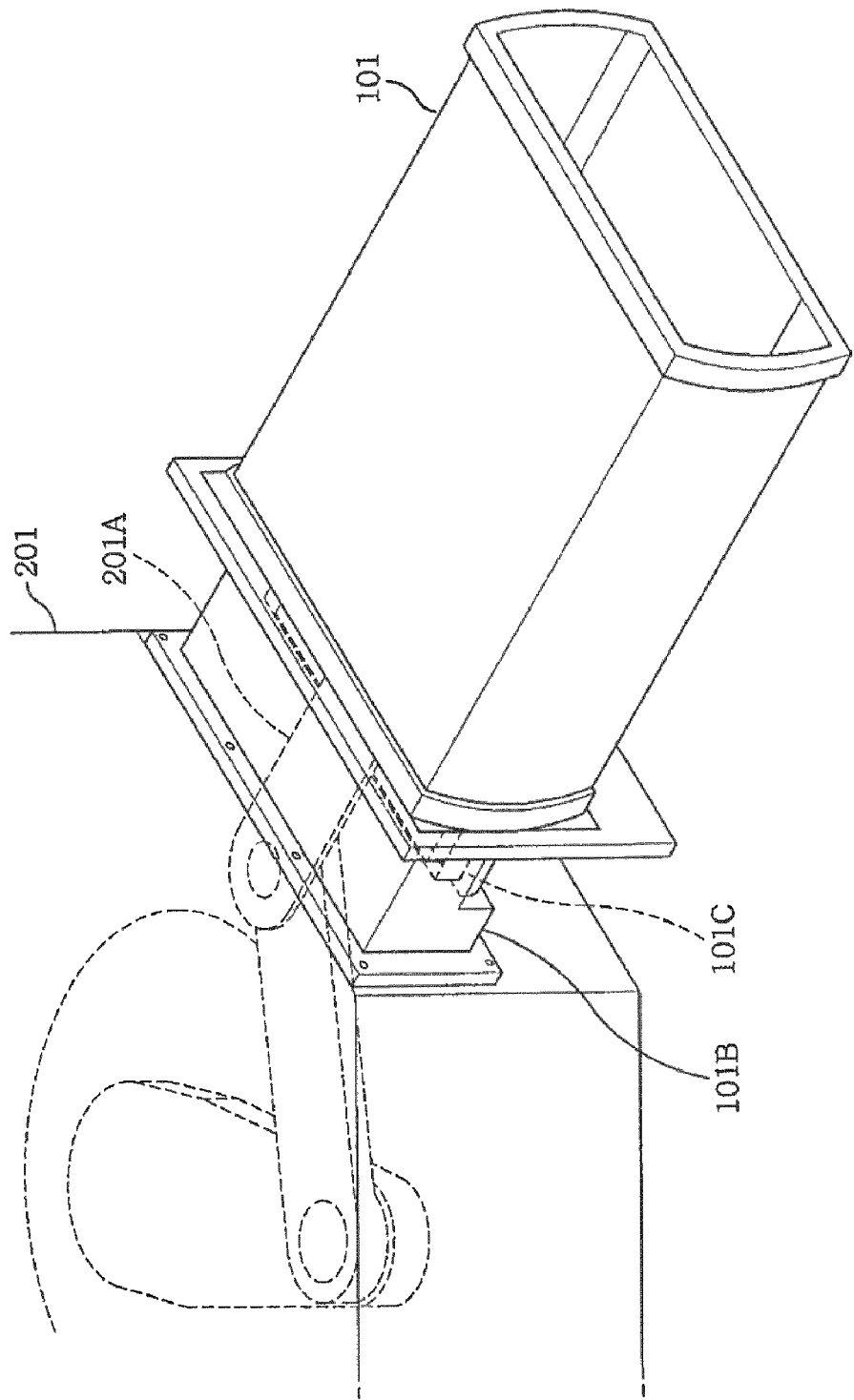
FIG. 7 depicts an example in which a transfer chamber is connected with a processing chamber.

FIG. 7 is a perspective view schematically showing an example of a film forming equipment in which a processing chamber 101 is connected with a transfer chamber 201 having a transfer arm (transfer unit) 201A. Here, like reference numerals are used for like parts described above, and redundant description thereof will be omitted. Further, the illustration of a gas exhaust line connected with the processing chamber 101 and the like is omitted.

Referring to FIG. 7, the processing chamber 101 described with reference to FIG. 4 is connected with a transfer chamber 201 having therein a transfer arm through a processing tube 101B. Further, a gas nozzle (film forming gas supply unit) 101C for supplying a film forming gas is installed below the processing tube 101B. The film forming gas is supplied through the gas nozzle 101C into the film forming gas supply space 101a (shown in FIG. 4).

In the above-described structure, the transfer plate 110 having thereon the substrates W shown in FIG. 5 is loaded from the transfer chamber 201 into the processing chamber 101, and is mounted on the substrate supporting unit 102. After the film formation on the substrates W is completed, the transfer plate 110 is unloaded from the processing chamber 101 into the transfer chamber 201 by the transfer arm 201A.

Figure 8:
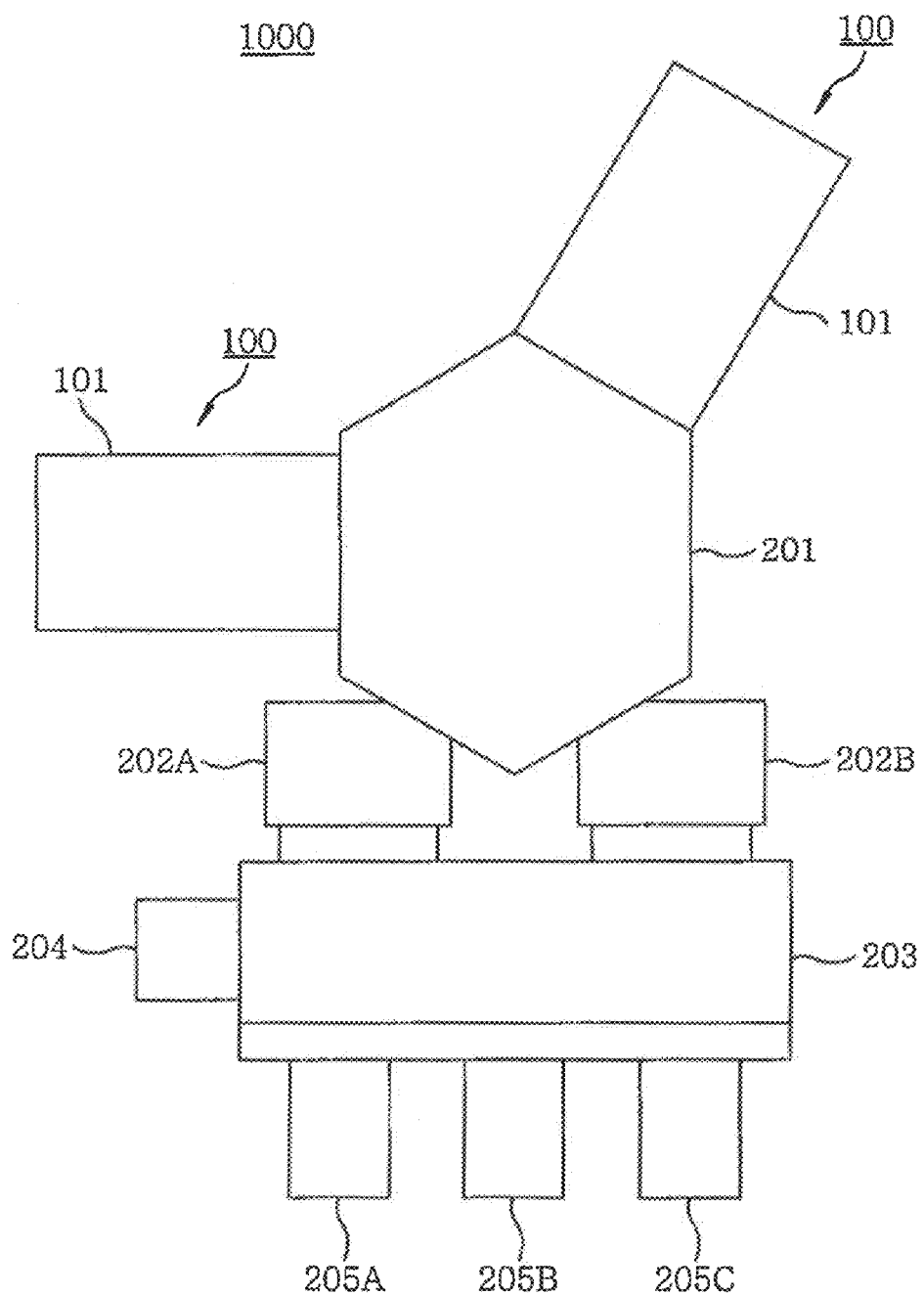
FIG. 8 offers an example in which a transfer chamber is connected with a plurality of processing chambers.

FIG. 8 is a top view schematically showing an example of a film forming equipment 1000 in which the transfer chamber 201 is connected with a plurality of processing chambers 101 (film forming apparatuses 100). Here, like reference numerals are used for like parts described above, and redundant description thereof will be omitted.

Referring to FIG. 8, the film forming equipment 1000 has ports 205A to 205C for mounting thereon a holder (not shown) on which the transfer plate 110 is mounted and a loader 203 serving as a transfer area of the corresponding holder.

Further, the loader 203 is connected with load-lock chambers 202A and 202B into which the transfer plate 110 is loaded, and the load-lock chambers 202A and 202B are connected with the transfer chamber 201 described in FIG. 8.

The transfer chamber 201 is connected with two processing chambers 101. Further, the illustration of other structures except the processing chamber 101 of the film forming apparatus 100 is omitted.

The transfer plate 110 (the substrates W) mounted on any one of the ports 205A to 205C is loaded into either one of the load-lock chambers 202A and 202B via the loader 203. Then, the transfer plate 110 is transferred from either one of the load-lock chambers 202A and 202B to the film forming apparatus 100 (processing chamber 101) via the transfer chamber 201. Further, if necessary, the position alignment of the transfer plate 110 can be performed by using a position alignment mechanism 204 installed at the loader 203.

After the film formation is completed by the film forming apparatus 100, the transfer plate 110 (the substrates W) is transferred to either one of the load-lock chamber 202A or 202B via the transfer chamber 201, and then is returned to any one of the ports 205A to 205C via the loader 203.

By connecting the transfer chamber 201 for transferring, e.g., the transfer plate 110 (the substrates W) or the like with the film forming apparatus 100 (the processing chamber 101), the film formation on the substrates can be carried out continuously and effectively.

Further, for example, a configuration of the substrate processing apparatus 1000 can be variously modified or changed without being limited to the above-described one. For example, the transfer chamber 201 may not be necessarily connected with two film forming apparatuses 100 (the processing chambers 101), and may also be connected with, e.g., three or four film forming apparatuses 100. Moreover, the transfer chamber 201 may be connected with an apparatus for performing substrate processing other than the film forming apparatus 100. In this manner, the configuration of the substrate processing apparatus can be modified if necessary, and the efficiency of the substrate processing (film formation) can be improved.

While the invention has been shown and described with respect to the embodiments, it will be understood by those skilled in the art that various changes and modification may be made without departing from the scope of the invention as defined in the following claims.

This international application claims priority to Japanese Patent Application No. 2006-348458 filed on Dec. 25, 2006, the entire contents of which are incorporated herein by reference.

INDUSTRIAL APPLICABILITY

In accordance with the present invention, it is possible to provide a film forming apparatus and a film forming method which can perform stable film formation by decomposing a film forming gas having a high decomposition temperature.

What is claimed is:

1. A film forming apparatus comprising:
   a processing chamber inside which a vacuum space is maintained and to which a film forming gas is supplied;
   a substrate supporting unit, which is disposed inside the processing chamber, for holding a substrate; and
   a heater which is made of a compound material, wherein the material includes Ta, Mo or W as a high-melting point metal and carbon, and wherein the heater is disposed inside the processing chamber to heat the substrate;
   a heat insulating member installed between the substrate supporting unit and the processing chamber and between the heater and the processing chamber; and
   a heat insulating member supporting structure made of quartz and formed outside the heat insulating member so as to cover the heat insulating member, wherein the heat insulating member supporting structure separates the vacuum space into a film forming gas supply space where the heat insulating member and the substrate supporting unit are installed and a heat insulating space defined between the processing chamber and the heat insulating member,
   wherein the heater includes a main body and a heating element embedded in the main body, and
   wherein the main body is made of the compound material.

2. The film forming apparatus of claim 1, wherein the compound material is mainly made of TaC.

3. The film forming apparatus of claim 1, wherein a film mainly made of Si and C is formed on the substrate by using the film forming gas.

4. The film forming apparatus of claim 3, wherein the film forming gas includes a gas represented by $C_xH_y$, wherein x and y are integers.

5. The film forming apparatus of claim 4, wherein the heater is configured to be heated to a temperature higher than or equal to 1500° C.

6. The film forming apparatus of claim 1, wherein the heater is divided into a plurality of parts, and each of the parts is independently controlled.

7. The film forming apparatus of claim 6, wherein at least two of the plurality of parts are arranged along a flow of the film forming gas.

* * * * *